United States Patent [19]

Nakamura et al.

[11] 4,309,266
[45] Jan. 5, 1982

[54] MAGNETRON SPUTTERING APPARATUS

[75] Inventors: Takeshi Nakamura, Uji; Suehiro Kato, Nagaokakyo; Hiroshi Nishiyama, Mukou, all of Japan

[73] Assignee: Murata Manufacturing Co., Ltd., Kyoto, Japan

[21] Appl. No.: 170,154

[22] Filed: Jul. 18, 1980

[51] Int. Cl.$^3$ ............................................. C23C 15/00
[52] U.S. Cl. ................................ 204/298; 204/192 R; 204/192 SP
[58] Field of Search ............... 204/192 R, 192 C, 298, 204/192 SP

[56] References Cited

FOREIGN PATENT DOCUMENTS 2707144  8/1977  Fed. Rep. of Germany ...... 204/298

Primary Examiner—Aaron Weisstuch
Attorney, Agent, or Firm—Birch, Stewart, Kolasch & Birch

[57] ABSTRACT

A magnetron sputtering apparatus for producing thin films, which comprises at least two spaced apart opposing electrodes, one of the electrodes having a space therein and being used for mounting a target thereon, from which film-forming atoms are ejected by ion-bombardment, the other electrode being used for mounting a substrate thereon, and a magnet arranged in the space of the target mounting electrode, characterized in that the magnet is mounted on a means for adjusting the distance between the target and the magnet, the means for adjusting said distance being provided in the one electrode on which the target is mounted.

The magnetron sputtering apparatus of the present invention enables one to adjust the magnetic flux density at the surface of the target by the adjustment of the distance between the target and the magnet, thus making it possible to produce thin films with uniform characteristics, even if the sputtering is repeated many times without exchange of the target.

6 Claims, 6 Drawing Figures

MAGNETRON SPUTTERING APPARATUS

BACKGROUND OF THE INVENTION

1. Field of the Invention

The present invention relates to a magnetron sputtering apparatus for producing thin films on substrates, which enables one to maintain the sputtering conditions constant during the sputtering operation, thus making it possible to produce uniform thin films of good quality.

2. Description of the Prior Art

There are many sputtering apparatus of various systems such as, for example, diode DC sputtering systems, triode DC sputtering systems and radio-frequency sputtering systems which are used for producing thin films on substrates. In such sputtering apparatus a magnet is fixed on the opposite side of an electrode which is adapted to hold a target, to accelerate ionized atoms of, an ionizable medium such as argon, oxygen and the like which sputter film-forming atoms from the surface of the target, thus making it possible to use high electrical power or to increase the sputtering rate.

However, the thickness of the target decreases with the progress of sputtering since the film-forming atoms are ejected from the surface of the target. This results in a change in the distance between the magnet and the surface of the target because of the fixed distance between the magnet and the electrode which are positioned opposite each other. Since the distance between the magnet and the surface of the target affects the magnetic flux density at the surface of the target, it is difficult to produce uniform thin films, even if other conditions such as the voltage applied to the cathode and the atmosphere are maintained constant.

It is therefore an object of the present invention to provide a sputtering apparatus for producing uniform thin films.

According to the present invention, there is provided a sputtering apparatus comprising at least two spaced apart electrodes which are positioned opposite to each other, one of said electrodes having a space provided therein and being used for mounting a target thereon, from which film-forming atoms are ejected by ion-bombardment, and the other electrode being used for mounting a substrate thereon. A magnet is disposed in said space by being mounted on means adjusting for adjusting the distance between the target and the magnet, said means for adjusting said distance being provided in said one electrode.

In a preferred embodiment of the present invention, means for adjusting the distance between the magnet and the target comprises a support movably arranged in said one electrode on which the target is mounted, and an adjustment screw loosely or fixedly secured to the support at its screw end and engaged with a tapped bore provided in the bottom of said one electrode.

In another embodiment of the present invention, means for adjusting the distance between the magnet and the target comprises a disk-shaped support provided with an external thread which is adapted to engage in an internal thread provided in the cylindrical electrode, and an adjustment shaft fixed to the disk-shaped support.

The magnet may comprise one or several permanent magnets or electromagnets.

According to the sputtering apparatus of the present invention, the magnetic flux density at the surface of the target can be adjusted by adjustment of the distance between the target and the magnet, thus making it possible to produce thin films with uniform characteristics even if the sputtering is repeated many times without exchange of the target. Furthermore, by keeping the initial magnetic flux density constant it is possible to improve the adhesion between the thin film and the substrate. In addition, it is possible to produce piezoelectric crystalline films of good orientation.

BRIEF DESCRIPTION OF THE DRAWINGS

The invention together with other objects, features and advantages thereof will be further understood by referring to the following description taken in conjunction with the accompanying drawings; wherein.

DETAILED DESCRIPTION OF THE INVENTION

Figure 1:
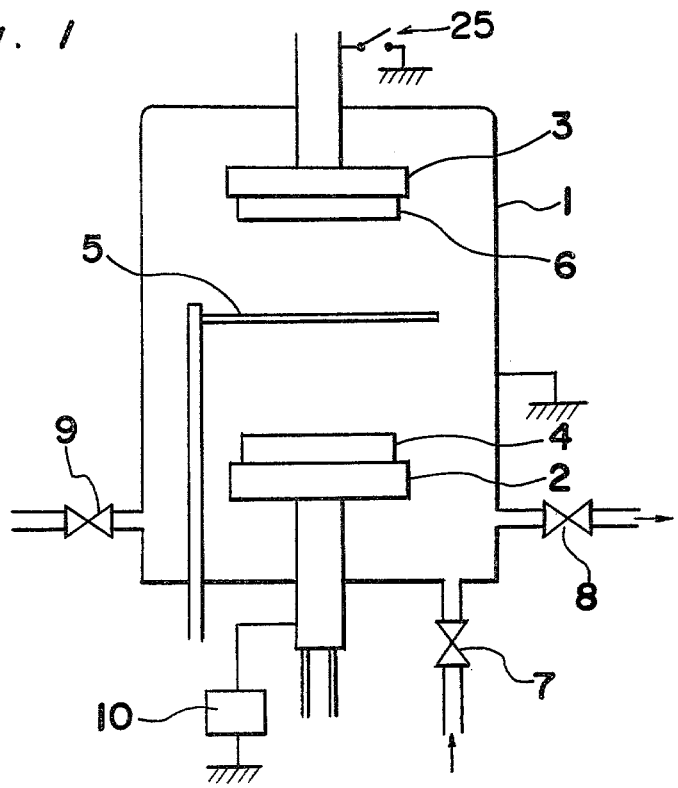
FIG. 1 is a schematic diagram showing the general construction of a radio-frequency sputtering apparatus applied to the present invention.

Referring now to FIG. 1 there is shown a high-rate radio-frequency diode sputtering apparatus which comprises a bell jar 1, a pair of opposed electrodes, i.e., a planar cathode 2 and a planar anode 3 parallelly arranged therein, and a shutter 5 positioned between the electrodes. The bell jar 1 is provided with vent 7 for introduction of air and a valve 8 which is connected to a known vacuum pump (not shown) and an inlet 9 for an ionizable medium such as oxygen gas, nitrogen gas, argon gas, a mixture thereof, and the like. The gas inlet 9 is connected to an ionizable medium source (not shown). The bell jar 1 is grounded. The anode 3 is grounded or insulated by closing or opening a switch 25. One terminal of a radio-frequency electric power source 10 of 13.5 MHz is electrically connected to the cathode 2 and the other terminal is grounded. A radio-frequency voltage is applied from the electric power source 10 between the cathode 2 and the bell jar 1. A target 4 of a film-forming material is mounted on the cathode 2. A substrate 6 on which a thin film is formed is mounted on the anode 3 standing opposite to the target 4, and heated to a temperature ranging from 200° to 500° C. during sputtering.

Figure 2:
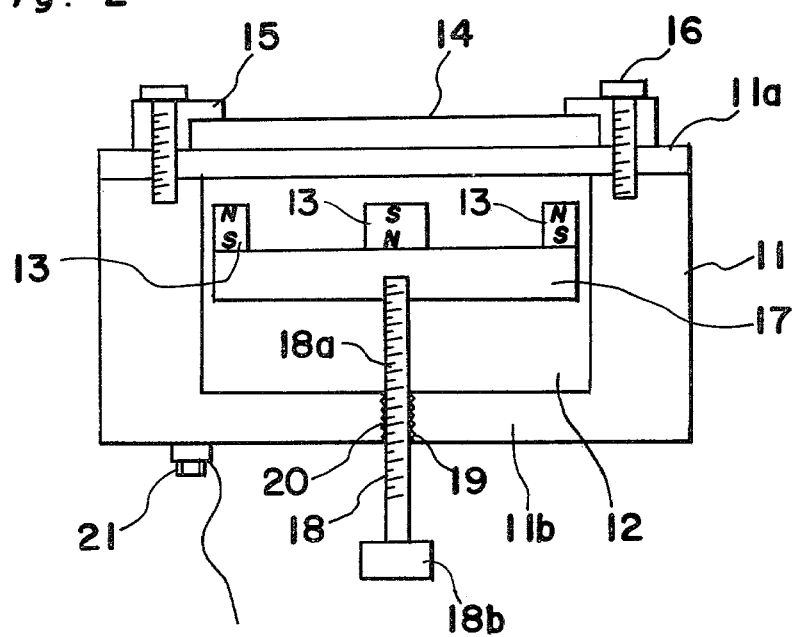
FIG. 2 is an enlarged view of FIG. 1 showing an essential part of the present invention.

Referring now to FIG. 2, the cathode 2 comprises a cylindrical cathode body 11 with a cylindrical recess 12 provided therein, and a cathode plate 11a on which a disc-shaped target 14 of a film-forming material such as, ceramics, glasses, resins, sintered alloys and the like is mounted by means of an O-ring 15 and bolts 16. In the space 12 formed between the cathode plate 11a and the cathode body 11, there is a magnet 13 standing opposite to the target 14. The cathode body is also provided with inlet and outlet pipes (not shown) so that cooling water is introduced into the space through the inlet pipe and drawn therefrom through the outlet pipe. Numeral 17 shows a disc-shaped support movably arranged in the space 12 of the cathode 2. An adjustment screw 18 with an external thread 18a and a knurled head 18b is loosely secured to the support 17 at its screw end and engaged with an internal screw 20 of a tapped bore 19 provided in the bottom 11b of the cathode body 11. By rotating the adjust screw 18 clockwise or counterclockwise, the magnet moves upwardly or downwardly; thus the distance between the target and the magnet is adjusted. Numeral 21 indicates a terminal through which radio-frequency electric power is supplied to the cathode body 11.

Figure 6:
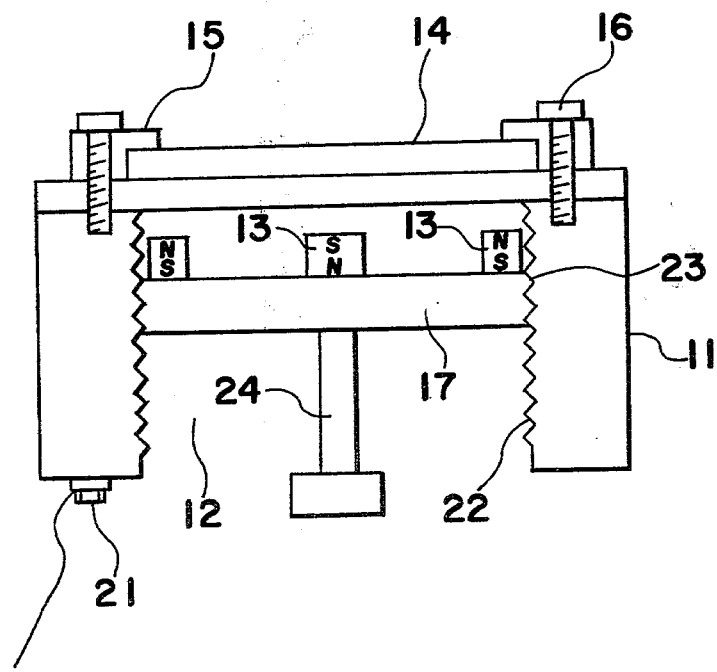
FIG. 6 is an enlarged view of an essential part of another embodiment of the present invention.

FIG. 6 shows another embodiment of the present invention in which means for adjusting the distance between the target and the magnet comprises a disk-shaped support 17 provided with an external thread 23 which is engaged with an internal thread 22 of a cylindrical cathode body 11. An adjustment shaft 24 is fixed to the center of the support 17 and extends downwardly therefrom. By rotating the adjust shaft 24 clockwise or counterclockwise, the support 17 rotates and moves upwardly or downwardly, thus making it possible to adjust the distance between the magnet and the target.

The above apparatus may be operated, for example, in the following manner. The bell jar 1, after being rendered airtight, is evacuated by the known vacuum pump through the valve 8 to a vacuum of more than $1 \times 10^{-6}$ Torr. An ionizable medium such as argon or oxygen or a mixture thereof is introduced into the bell jar 1 through the gas inlet 9, thereby adjusting the pressure in the bell jar to $1 \times 10^{-1}$ to $1 \times 10^{-4}$ Torr. A radio-frequency voltage is applied to the cathode 2 from the radio-frequency electric power source 10 to discharge electricity, thereby effecting the ionization of the ionizable medium. When applying the voltage, the switch 25 is generally opened to insulate the anode 3 from the ground. The ions of the medium impact the target so that atoms of the film-forming material are ejected from the surface of the target 4 as a result of the ion-bombardment and are deposited on the substrate 6 to form a thin film.

EXAMPLE 1

Using a high-rate radio-frequency diode sputtering apparatus of FIGS. 1 and 2, piezoelectric thin films were formed on glass substrates and acoustic surface wave filters were prepared in the following manner.

A target of a ceramic having a composition consisting essentially of 99% of zinc oxide and 1% of Mn was mounted on the cathode. After the bell jar 1 was rendered airtight, it was evacuated through the valve 8 to $1 \times 10^{-6}$ Torr and then supplied with an ionizable medium consisting essentially of a mixture of 10 vol% of oxygen and 90 vol% of argon, thereby adjusting the vacuum in the bell jar to $5 \times 10^{-3}$ Torr. The radio-frequency sputtering was carried out by supplying radio-frequency electric power from the power source 10 to the cathode 2. The adjustment of the distance between the magnet and the surface of the target was carried out by means of the adjustment screw 18, thereby, the magnetic flux density at the surface of the target was set at a predetermined value. After the adjustment of the distance, the sputtering was carried out until the thickness of the thin film reached 20 $\mu$m. The produced thin film was taken out from the apparatus to prepare acoustic surface wave filters described below. Then, a new substrate was mounted on the cathode and the sputtering was carried out again after the adjustment of the magnetic flux density to the predetermined value. Such procedures were repeated thereafter. The values of magnetic flux density G measured before and after adjustment of the distance are plotted in FIG. 4 by solid line A.

Figure 3:
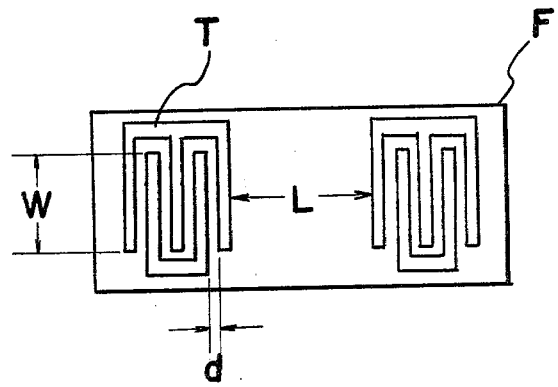
FIG. 3 is a plan view of an acoustic surface wave filter.

Using thus prepared thin films formed on the substrates, acoustic surface wave filters with a center frequency of 58 MHz were prepared in the following manner. An aluminum layer was vapour-deposited over the thin film F and then etched in the conventional manner to form a pair of interdigital transducers T as shown in FIG. 3. The dimensions of the transducer are as follows:

Distance d between fingers = 11.4 $\mu$m
Number of fingers = 15 pairs
width W = 1.0 mm
Length L of finger = 1.0 mm The thus prepared acoustic surface wave filters were subjected to measurement of the center frequency f. The results are shown in FIG. 5 by solid line A.

Figure 4:
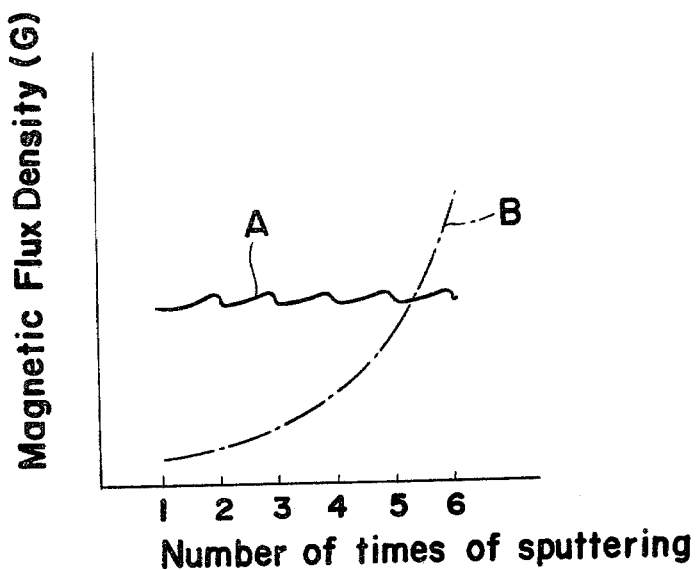
FIG. 4 is a graph showing the relationship between the number of times of sputtering and magnetic flux density.

For comparison purposes, thin films were prepared by the conventional sputtering apparatus having no means for adjustment of the distance between the magnet and the surface of the target. The magnetic flux density G was measured whenever a new substrate was mounted on the cathode. The results are shown in FIG. 4 by broken line B. The center frequency of the acoustic surface wave filters prepared by using the comparative thin films are shown in FIG. 5 by broken line B.

Figure 5:
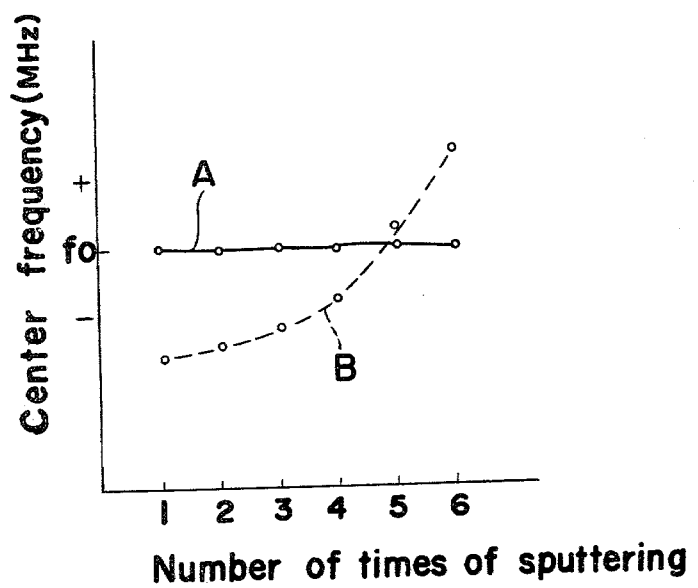
FIG. 5 is a graph showing the relationship between the number of sputtering and center frequency of an acoustic surface wave filter.

As can be seen from FIGS. 4 and 5, in the conventional sputtering apparatus the magnetic flux density varies with the lapse of time, which results in variation of the center frequency of the acoustic surface wave filter. In contrast therewith, the apparatus according to the present invention enables one to keep the magnetic flux density approximately constant as shown in FIG. 4 and to produce acoustic surface wave filters with constant center frequency.

In the foregoing, the present invention has been described in connection with a magnetron diode radio-frequency sputtering apparatus, but it will be apparent that the present invention may be applied to any other magnetron sputtering apparatus such as, for example, diode DC magnetron sputtering apparatus, triode DC magnetron sputtering apparatus, reactive magnetron sputtering apparatus, magnetron biassing sputtering apparatus and the like.

Further, the present invention may be applied to any other target material such as glasses, synthetic resins, sintered alloys and the like.

Further, in the foregoing embodiment, the apparatus is used for producing piezoelectric thin films for acoustic surface wave filters, but it can be used for producing piezoelectric thin films used for other purposes, dielectric thin films, resistive thin films, insulating thin flims, etc.

What we claim is:

1. A magnetron sputtering apparatus for producing thin films comprising,
   at least two spaced apart, opposing electrodes, a target from which film-forming atoms are ejected by ion-bombardment, mounted on one of said electrodes, said electrode mounting said target having a space provided therein,
   a substrate mounted on the other of said electrodes,
   a magnet movably disposed in said space, and
   means for adjusting the distance between said magnet and said target, said means for adjusting said distance being operatively associated with said one electrode.

2. The sputtering apparatus according to claim 1 wherein the means for adjusting the distance between the magnet and the target comprises a support movably disposed in the space of said one electrode on which the target is mounted, and adjusting screw secured to the support at its screw end and operatively engaged with a tapped bore is provided in the bottom of said one electrode.

3. The sputtering apparatus according to claim 1 wherein said means for adjusting the distance between the magnet and the target comprises a disk-shaped support provided with an external thread and a cylindrical electrode provided with corresponding internal thread for engagement with said external threads, and means fixed to said disk-shaped support for adjusting said distance.

4. The sputtering apparatus according to claim 1 wherein the magnet is a permanent magnet or an electromagnet.

5. The magnetron sputtering apparatus of claim 1 wherein the means for adjusting the distance between the magnet and the target provides a constant flux density which makes it possible to produce thin films with uniform characteristics and piezoelectric crystalline films with good orientation.

6. A magnetron sputtering apparatus for producing acoustic surface wave filters with a constant center frequency which comprises at least two spaced apart, opposing electrodes, a target from which film-forming atoms are ejected by ion-bombardment, mounted on one of said electrodes, said electrode mounting said target having a space provided therein, a substrate mounted on the other of said electrodes, a magnet movably disposed in said space, and means for adjusting the distance between said magnet and said target, said means for adjusting said distance being operatively associated with said one electrode.

* * * * *